United States Patent [19]
Lai et al.

[11] Patent Number: 5,381,055
[45] Date of Patent: Jan. 10, 1995

[54] CMOS DRIVER USING OUTPUT FEEDBACK PRE-DRIVE

[75] Inventors: Stephen W. Lai, Chandler; Gregory Djaja, Tempe; Solomon G. Meskel, Mesa, all of Ariz.

[73] Assignee: Motorola, Inc., Schaumburg, Ill.

[21] Appl. No.: 98,993

[22] Filed: Jul. 29, 1993

[51] Int. Cl.⁶ .................. H03K 19/0948; H03K 17/16
[52] U.S. Cl. ........................................ 326/27; 326/121; 327/108
[58] Field of Search ............... 307/443, 451, 475, 448, 307/263, 579, 572

[56] References Cited

U.S. PATENT DOCUMENTS

| | | |
|---|---|---|
| 4,703,203 | 10/1987 | Gallup et al. ................ 307/475 |
| 4,746,817 | 5/1988 | Banker et al. ................ 307/451 |
| 4,818,901 | 4/1989 | Young et al. ................ 307/443 |
| 5,280,200 | 1/1994 | Tarng ................ 307/451 |

Primary Examiner—Edward P. Westin
Assistant Examiner—Jon Santamauro
Attorney, Agent, or Firm—Rennie W. Dover

[57] ABSTRACT

A CMOS driver (10) with output feedback pre-drive has been provided. The CMOS driver includes first (14) and second (16) output devices for providing drive current at an output (18). The CMOS driver includes an output feedback pre-drive circuit (12) which includes complementary P and N feedback devices (26, 28, 30, 32) that are coupled across the gate and drain electrodes of the output devices and which are controlled by an input signal.

4 Claims, 1 Drawing Sheet

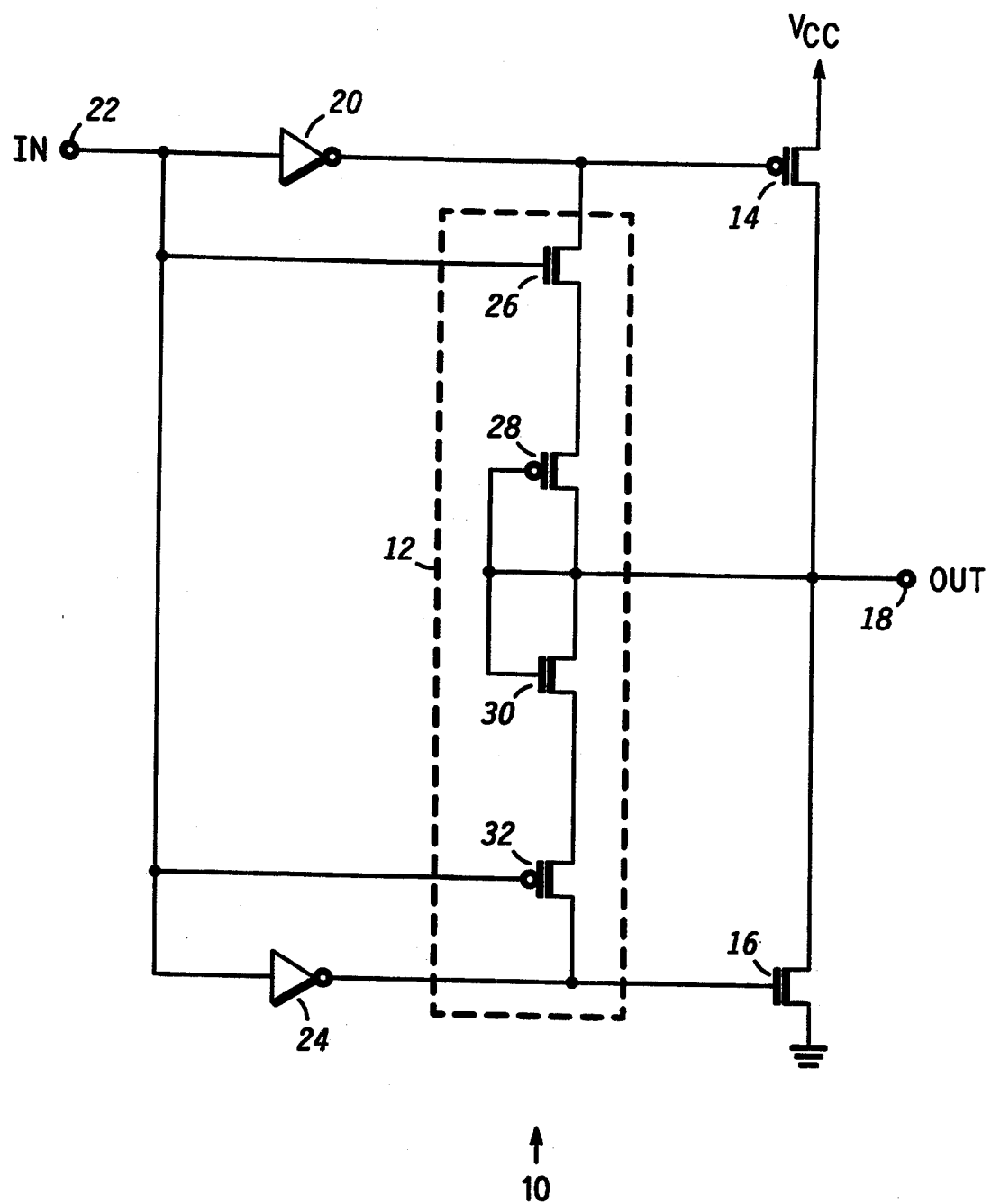

CMOS DRIVER USING OUTPUT FEEDBACK PRE-DRIVE

FIELD OF THE INVENTION

This invention relates to drivers and, in particular but not limited to, high speed, low noise CMOS drivers using output feedback pre-drive.

BACKGROUND OF THE INVENTION

In general, large devices are used in CMOS buffers to drive large loads at high speeds. These large devices can sink or source large amounts of current and are turned on and off in short time durations. However, parasitic inductances are always present at chip package supply pins and, thus, inductive voltage transients can exceed the noise margin requirements. Further, this problem is exacerbated when many outputs are switching together. As a result, when high speed is required, an acceptable noise margin is typically difficult to obtain without special input/output (I/O) customization. Further, switching noise has become even more of a problem as circuits are required to run at higher frequencies, and as noise sensitive analog circuit functions are integrated with digital circuits.

At least one attempt that prior art has made to solve this problem is to control the drive to the gate of the output devices by, for example, an RC circuit. However, this approach requires the use of resistors and the choice of the values for the resistors cannot be optimized for different loading. Moreover, the RC circuit substantially increases propagation delay.

Another attempt made by prior art is the use of a staggered turn on/turn off of the output devices. However, this approach requires fine tuning of the cascaded turn on/turn off for each of the output devices, and the fine tuning does not take loading effects into account.

Hence, there exists a need for an improved high speed, low noise CMOS driver having optimized speed/noise trade off characteristics.

BRIEF DESCRIPTION OF THE DRAWING

The sole figure illustrates a detailed schematic diagram of a CMOS driver having output feedback pre-drive in accordance with the present invention.

DETAILED DESCRIPTION OF THE DRAWINGS

Referring to the sole figure, CMOS driver 10 having output feedback pre-drive circuit 12 is shown. CMOS driver 10 includes output transistors/devices 14 and 16 for providing drive current at output terminal 18. In particular, the source electrode of drive transistor 14 is coupled to a first supply voltage terminal at which the operating potential $V_{CC}$ is applied, while the drain electrode of transistor 14 is coupled to terminal 18 and to the drain electrode of drive transistor 16. The source electrode of transistor 16 is coupled to a second supply voltage terminal at which ground reference is applied. The control electrode of transistor 14 is coupled to an output of inverter 20 the latter having an input coupled to terminal 22 at which an input signal is applied. Similarly, the control electrode of transistor 16 is coupled to an output of inverter 24 the later having an input coupled to terminal 22.

Output pre-drive circuit 12 includes complementary transistors 26 and 28 coupled across the gate and drain electrodes of output transistor 14. Similarly, output feedback pre-drive circuit 12 includes complementary transistors 30 and 32 coupled across the gate and drain electrodes of output transistor 16. In particular, transistor 26 has a drain electrode coupled to the gate electrode of transistor 14 and a source electrode coupled to the source electrode of transistor 28. The drain electrode of transistor 28 is coupled to output terminal 18. The gate electrode of transistor 26 is coupled to terminal 22 while the gate electrode of transistor 28 is coupled to its drain electrode.

The gate and drain electrodes of transistor 30 are coupled to output terminal 18 while the source electrode of transistor 30 is coupled to the source electrode of transistor 32. The drain electrode of transistor 32 is coupled to the gate electrode of transistor 16 while the gate electrode of transistor 32 is coupled to input terminal 22.

In operation, complementary P and N feedback devices 26 and 28 (coupled across the gate and drain electrodes of output device 14) and complementary P and N feedback transistors 30 and 32 (coupled across the gate and drain electrodes of output transistor 16) provide gate drive to its respective output transistor (14 or 16) by stealing charge from a load (not shown and typically coupled to terminal 18) and, thus, minimizing current from chip supplies. Further, the gate drive to the output transistors is initially limited to one threshold voltage below supplies, thus limiting the maximum output current.

As an example, suppose that a logic high voltage level appears at terminal 22. This will render output drive transistor 14 operative and output drive transistor 16 non-operative. Further, transistor 26 and 28 will be operative and conduct current, while transistors 32 and 30 will be non-operative and not conduct current. Since output transistor 14 is being turned on, it will function to pull a voltage appearing at output terminal 18 to a logic high voltage as desired. The size of P transistor 28 is chosen so that transistor 28 will turn on output transistor 14 fast by providing gate drive to output transistor 14 by stealing charge from a load (not shown) via terminal 18. However, the gate electrode of transistor 14 is not pulled completely to ground (rather it is maintained at one diode voltage above the voltage appearing at terminal 18 via transistor 28) thereby limiting the maximum current through transistor 14 and limiting the noise associated with the switching of current through transistor 14.

From the foregoing discussion, it can be seen that the present invention has many advantages. First, no special circuit elements such as reference voltages or current sources are required. Also, no special or parasitic resistors are required. The present invention does not reduce static or DC current drive capacity of the output devices. There is no large penalty in speed and silicon area. In addition, the present invention is a simple circuit which allows its use together with other low noise design techniques.

By now it should be apparent from the foregoing discussion that a novel CMOS driver with output feedback pre-drive has been provided. The CMOS driver includes first and second output devices for providing drive current at an output. The CMOS driver includes an output feedback pre-drive circuit which includes complementary P and N feedback devices that are coupled across the gates and drain electrodes of the output devices and which are controlled by an input signal.

While the invention has been described in specific embodiments thereof, it is evident that many alterations, modifications and variations will be apparent to those skilled in the art. Further, it is intended to embrace all such alterations, modifications and variations in the appended claims.

I claim:

1. A CMOS driver circuit having first and second output transistors for supplying output drive current at an output, the first output transistor having first and second current carrying electrodes coupled between the output and a first supply voltage terminal and a control electrode responsive to an input signal, the second output transistor having first and second current carrying electrodes coupled between the output and a second supply voltage terminal and a control electrode responsive to the input signal, the CMOS driver including an output feedback circuit comprising:
 a first pair of complementary transistors responsive to the input signal and being coupled across the control and first current carrying electrodes of the first output transistor; and
 a second pair of complementary transistors responsive to the input signal and being coupled across the first current carrying and control electrodes of the second output transistor.

2. A CMOS driver circuit having first and second output transistors for supplying output drive current at an output, the first output transistor having first and second current carrying electrodes coupled between the output and a first supply voltage terminal and a control electrode responsive to an input signal, the second output transistor having first and second current carrying electrodes coupled between the output and a second supply voltage terminal and a control electrode responsive to the input signal, the CMOS driver including an output feedback circuit comprising:
 a first transistor having first and second current carrying electrodes and a control electrode, said first current carrying electrode of said first transistor coupled to the control electrode of the first output transistor, said control electrode of said first transistor responsive to the input signal;
 a second transistor having first and second current carrying electrodes and a control electrode, said first current carrying electrode of said second transistor coupled to the output, said second current carrying electrode of said second transistor coupled to said second current carrying electrode of said first transistor, said control electrode of said second transistor coupled to said first current carrying electrode of said second transistor;
 a third transistor having first and second current carrying electrodes and a control electrode, said first current carrying electrode of said third transistor coupled to the output, said control electrode of said third transistor coupled to said first current carrying electrode of said third transistor; and
 a fourth transistor having first and second current carrying electrodes and a control electrode, said first current carrying electrode of said fourth transistor coupled to the control electrode of the second output transistor, said second current carrying electrode of said fourth transistor coupled to said second current carrying electrode of said third transistor, said control electrode of said fourth transistor coupled responsive to the input signal.

3. A CMOS driver circuit having an input and an output, comprising:
 a first output transistor having first and second current carrying electrodes and a control electrode, said first and second current carrying electrodes of said first output transistor respectively coupled between the output and a first supply voltage terminal, said control electrode of said first output transistor coupled to the input
 a second output transistor having first and second current carrying electrodes and a control electrode, said first and second current carrying electrodes of said second output transistor respectively coupled between the output and a second supply voltage terminal, said control electrode of said second output transistor coupled to the input;
 first output feedback means coupled between said control and first current carrying electrodes of said first output transistor for providing drive to said first output transistor, said first output feedback means having an input coupled to the input, said first output feedback means including:
  a first transistor having first and second current carrying electrodes and a control electrode, said first current carrying electrode of said first transistor coupled to said control electrode of said first output transistor, said control electrode of said first transistor coupled to the input; and
  a second transistor having first and second current carrying electrodes and a control electrode, said first current carrying electrode of said second transistor coupled to the output, said second current carrying electrode of said second transistor coupled to said second current carrying electrode of said first transistor, said control electrode of said second transistor coupled to said first current carrying electrode of said second transistor; and
 second output feedback means coupled between said control and first current carrying electrodes of said second output transistor for providing drive to said second output transistor, said second output feedback means having an input coupled to the input.

4. The CMOS driver circuit according to claim 3 wherein said second output feedback means includes:
 a first transistor having first and second current carrying electrodes and a control electrode, said first current carrying electrode of said first transistor coupled to the output, said control electrode of said first transistor coupled to said first current carrying electrode of said first transistor; and
 a second transistor having first and second current carrying electrodes and a control electrode, said first current carrying electrode of said second transistor coupled to said control electrode of said second output transistor, said second current carrying electrode of said second transistor coupled to said second current carrying electrode of said first transistor, said control electrode of said second transistor coupled to the input.

* * * * *